(12) United States Patent
Kao et al.

(10) Patent No.: US 9,308,603 B2
(45) Date of Patent: Apr. 12, 2016

(54) SOLDER, SOLDER JOINT STRUCTURE AND METHOD OF FORMING SOLDER JOINT STRUCTURE

(71) Applicant: Industrial Technology Research Institute, Hsinchu (TW)

(72) Inventors: Kuo-Shu Kao, Hsinchu (TW); Tao-Chih Chang, Taoyuan County (TW); Wen-Chih Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 105 days.

(21) Appl. No.: 13/855,719

(22) Filed: Apr. 3, 2013

(65) Prior Publication Data
US 2014/0134459 A1 May 15, 2014

(30) Foreign Application Priority Data
Nov. 15, 2012 (TW) .............................. 101142671 A

(51) Int. Cl.
*B32B 15/20* (2006.01)
*B23K 35/24* (2006.01)
(Continued)

(52) U.S. Cl.
CPC ............... *B23K 35/24* (2013.01); *B23K 35/282* (2013.01); *B23K 35/302* (2013.01); *B23K 35/3013* (2013.01); *B32B 15/01* (2013.01); *B32B 15/018* (2013.01); *H01L 23/49513* (2013.01); *H01L 24/29* (2013.01); *H01L 24/32* (2013.01); *H01L 24/83* (2013.01); *H01L 23/3735* (2013.01); *H01L 23/49582* (2013.01); *H01L 24/03* (2013.01); *H01L 24/05* (2013.01); *H01L 24/27* (2013.01); *H01L 25/0657* (2013.01); *H01L 2224/0345* (2013.01); *H01L 2224/04026* (2013.01); *H01L 2224/05647* (2013.01); *H01L 2224/05655* (2013.01); *H01L 2224/2612* (2013.01); *H01L 2224/27826* (2013.01); *H01L 2224/291* (2013.01); *H01L 2224/29118* (2013.01); *H01L 2224/29561* (2013.01);
(Continued)

(58) Field of Classification Search
None
See application file for complete search history.

(56) References Cited

U.S. PATENT DOCUMENTS 5,775,569 A * 7/1998 Berger et al. ................. 228/254
7,018,721 B2 3/2006 Nakamura
(Continued)

FOREIGN PATENT DOCUMENTS

CN 1442031 9/2003
CN 1444273 9/2003
(Continued)

OTHER PUBLICATIONS

Takao et al., Influence of Noble Metal Coating on Wetting of Copper Substrate by Sn—Ag Eutectic Solder, Materials Transactions vol. 45, No. 3 (2004) pp. 747 to 753.*
(Continued)

*Primary Examiner* — Adam Krupicka
(74) *Attorney, Agent, or Firm* — Jianq Chyun IP Office

(57) ABSTRACT

A solder and a solder joint structure formed by the solder are provided. The solder includes a zinc-based material, a copper film, and a noble metal film. The copper film completely covers the surface of the zinc-based material. The noble metal film completely covers the copper film. The solder joint structure includes a zinc-based material and an intermetallic layer. The intermetallic layer consists of zinc and noble metal and completely covers the surface of the zinc-based material.

7 Claims, 7 Drawing Sheets

(51) Int. Cl.
*B32B 15/01* (2006.01)
*B23K 35/28* (2006.01)
*B23K 35/30* (2006.01)
*H01L 23/495* (2006.01)
*H01L 23/00* (2006.01)
*H01L 23/373* (2006.01)
*H01L 25/065* (2006.01)

(52) U.S. Cl.
CPC ............ *H01L 2224/29565* (2013.01); *H01L 2224/29582* (2013.01); *H01L 2224/29583* (2013.01); *H01L 2224/29639* (2013.01); *H01L 2224/29644* (2013.01); *H01L 2224/29647* (2013.01); *H01L 2224/29663* (2013.01); *H01L 2224/29664* (2013.01); *H01L 2224/29669* (2013.01); *H01L 2224/29673* (2013.01); *H01L 2224/29676* (2013.01); *H01L 2224/29678* (2013.01); *H01L 2224/32145* (2013.01); *H01L 2224/32225* (2013.01); *H01L 2224/32245* (2013.01); *H01L 2224/32503* (2013.01); *H01L 2224/32507* (2013.01); *H01L 2224/83007* (2013.01); *H01L 2224/8309* (2013.01); *H01L 2224/83101* (2013.01); *H01L 2224/83203* (2013.01); *H01L 2224/83447* (2013.01); *H01L 2224/83455* (2013.01); *H01L 2224/83815* (2013.01); *H01L 2924/1033* (2013.01); *H01L 2924/10253* (2013.01); *H01L 2924/10272* (2013.01); *H01L 2924/1305* (2013.01); *H01L 2924/1306* (2013.01); *H01L 2924/13055* (2013.01); *H01L 2924/13091* (2013.01); *H01L 2924/15747* (2013.01); *H01L 2924/15787* (2013.01); *Y10T 428/12792* (2015.01)

(56) References Cited

U.S. PATENT DOCUMENTS

| | | | |
|---|---|---|---|
| 8,071,472 | B2 | 12/2011 | Kawashiro |
| 8,125,090 | B2 | 2/2012 | Soga et al. |
| 2002/0192488 | A1 | 12/2002 | Kurihara et al. |
| 2003/0199159 | A1* | 10/2003 | Fan et al. ............... 438/612 |
| 2006/0067853 | A1 | 3/2006 | Takahashi et al. |
| 2008/0230905 | A1 | 9/2008 | Guth et al. |
| 2009/0297879 | A1 | 12/2009 | Zeng et al. |
| 2010/0019380 | A1 | 1/2010 | Lin et al. |
| 2010/0109016 | A1 | 5/2010 | Yagi et al. |
| 2010/0112353 | A1 | 5/2010 | Sun et al. |
| 2010/0193801 | A1* | 8/2010 | Yamada et al. ............ 257/77 |
| 2011/0175224 | A1 | 7/2011 | Nakamura et al. |

FOREIGN PATENT DOCUMENTS

| | | |
|---|---|---|
| TW | I261330 | 9/2006 |
| TW | 200908264 | 2/2009 |
| TW | 201015682 | 4/2010 |
| TW | 201023282 | 6/2010 |
| TW | 201133733 | 10/2011 |
| TW | 201205698 | 2/2012 |

OTHER PUBLICATIONS

"Office Action of Taiwan Counterpart Application", issued on Aug. 13, 2014, p. 1-p. 4.

Seongjun Kim, et al., "Interfacial Reaction and Die Attach Properties of Zn—Sn High-Temperature Solders", Journal of Electronic Materials, vol. 38, No. 2, Feb. 2009, pp. 266-272.

Toshihide Takahashi, et al., "Improvement of high temperature performance of Zn—Sn solder joint", Journal of Electronic Materials, vol. 39, No. 8, Aug. 2010, pp. 1241-1247.

Seongjun Kim, et al., "Improving the Reliability of Si Die Attachment with Zn—Sn-Based High-Temperature Pb-Free Solder Using a TiN Diffusion Barrier", Journal of Electronic Materials, vol. 38, No. 12, Dec. 2009, pp. 2668-2675.

Heidi L. Reynolds, et al., "Investigations of Zinc (Zn) Whiskers using FIB Technology", the IPC/JEDEC Lead Free North America Conference, Dec. 3, 2004, Boston, pp. 1-7.

Cheng-Kuan Lin, "Interfacial Reactions in the Sn—Zn/Au Couples", National Taiwan University of Science and Technology, Thesis of Materials Science and Engineering Department, Jun. 2011, pp. 1-97.

Vemal Raja Manikam, et al., "Die Attach Materials for High Temperature Applications: A Review", IEEE, Transactions on Components, Packaging and Manufacturing Technology, vol. 1, No. 4, Apr. 2011, pp. 457-478.

R. Mahmudi, et al.,"Impression Creep Behavior of Zn—Sn High-Temperature Lead-Free Solders", Journal of Electronic Materials, vol. 39, No. 11, Nov. 2010, pp. 2495-2502.

Seongjun Kim, et al.,"Interfacial Reactions of Si Die Attachment with Zn—Sn and Au—20Sn High Temperature Lead-Free Solders on Cu Substrates", Journal of Electronic Materials, vol. 38, No. 6, Jun. 2009, pp. 873-883.

R. Mahmudi, et al.,"Shear strength of the Zn—Sn high-temperature lead-free solders", J Mater Sci: Mater Electron, vol. 22, 2011, pp. 1168-1172, published on line: Dec. 28, 2010.

K. Suganuma, et al.,"Ultra Heat-Shock Resistant Die Attachment for Silicon Carbide With Pure Zinc", IEEE, Electron Device Letters, vol. 31, No. 12, Dec. 2010, pp. 1467-1469.

Jay Brusse, "Could Zinc Whiskers Be Impacting Your Electronics?", QSS Group, Inc. at NASA Goddard Space Flight Center, Apr. 2, 2003, pp. 1-20.

"Office Action of China Counterpart Application," issued on Dec. 28, 2015, p. 1-p. 16.

* cited by examiner

SOLDER, SOLDER JOINT STRUCTURE AND METHOD OF FORMING SOLDER JOINT STRUCTURE

CROSS-REFERENCE TO RELATED APPLICATION

This application claims the priority benefit of Taiwan application serial no. 101142671, filed on Nov. 15, 2012. The entirety of the above-mentioned patent application is hereby incorporated by reference herein and made a part of this specification.

TECHNICAL FIELD

The disclosure relates to a solder joint structure, a solder for forming the solder joint structure, and a method of forming the solder joint structure.

BACKGROUND

To improve energy conversion efficiency of power modules, fabrication of devices with use of silicon carbide (SiC) base chip or gallium nitride (GaN) base chip in place of a silicon base chip is regarded as a next-generation technique for power semiconductor switches. For example, SiC devices provide low conductor resistance, fast switching speed, and small power loss, and can operate at a high temperature; thus, the SiC devices comply with the development trend of high-power devices. However, when silicon-based power modules are in operation, the junction temperature Tj is around 150° C., which is still within the acceptable temperature range of a lead-free solder material (e.g., Sn3.0Ag0.5Cu); when the SiC device modules are introduced, the junction temperature Tj increases to above 175° C. even for medium-to-low wattage power control modules, and the initial melting temperature of Sn3.0Ag0.5Cn is only 217° C. Therefore, on such temperature conditions, serious creep effects may take place, which is disadvantageous for maintaining mechanical strength of junction points and satisfying requirements for long-term reliability, not to mention products such as car power modules which are applied at the junction temperature Tj of 250° C. Accordingly, in a SiC power module package, the use of high temperature lead-free solder is one of the factors in deciding quality and lifespan of the products.

In view of the above, high temperature lead-free solders or high temperature resistant die bonding processes have been developed by many research organizations. Currently, high temperature lead-free solders, such as AuSn-based solders, BiAg-based solders, Ag paste sintering, and Zn-based solders, have been widely used.

Compared to other high temperature solders, the Zn-based solder characterized by low costs, proper melting range, and good thermal and electrical conductivity is rather suitable for being applied to power module packaging in replacement of other high temperature solders. However, the Zn-based solder is prone to oxidation. Besides, in a high temperature bonding process, the Zn-based solder is readily reacted with other metal (e.g., copper) to form intermetallic compounds, such as $CuZn_5$ and $Cu_5Zn_8$, thereby impairing long-term reliability of the power modules.

SUMMARY

The disclosure provides a solder that includes a zinc-based material, a copper film, and a noble metal film. The copper film completely covers a surface of the zinc-based material, and the noble metal film completely covers the copper film.

The disclosure provides a solder joint structure that includes a zinc-based material and an intermetallic layer. The intermetallic layer consists of zinc and noble metal and completely covers a surface of the zinc-based material.

The disclosure provides a method of forming a solder joint structure. The forming method includes following steps. A solder is provided. The solder includes a zinc-based material, a copper film, and a noble metal film. The copper film completely covers a surface of the zinc-based material. The noble metal film completely covers the copper film. The solder is bonded to diffuse copper contained in the copper film into the zinc-based material, and to allow noble metal contained in the noble metal film to react with zinc contained in the zinc-based material so as to form an intermetallic layer completely covering the zinc-based material.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
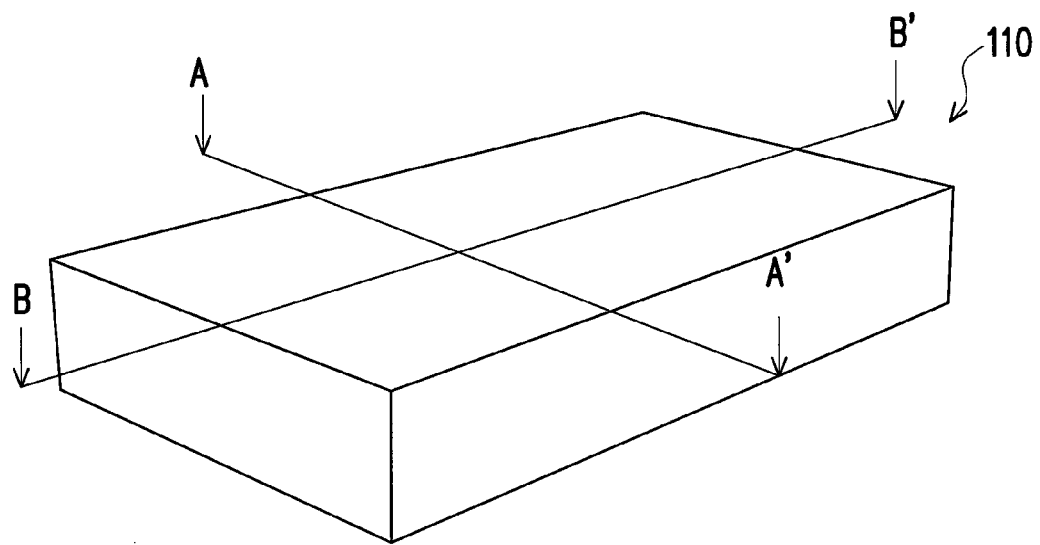
FIG. 1A is a three-dimensional view of a solder according to a first embodiment.
Figure 1B:
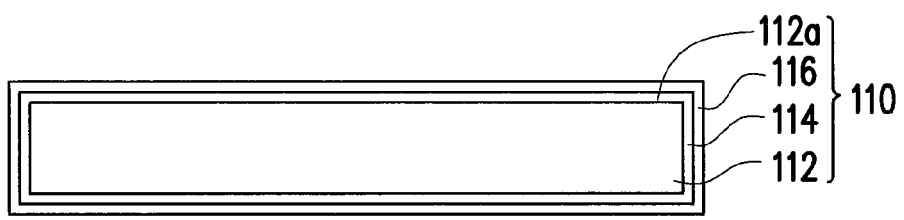
FIG. 1B and FIG. 1C are cross-sectional views taken along a line AA' and a line BB' of FIG. 1A, respectively.
Figure 1C:
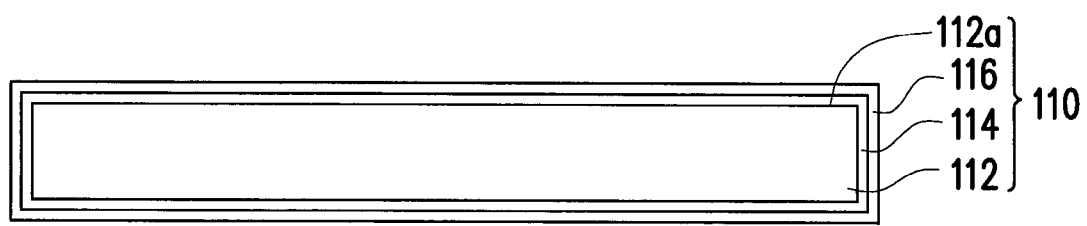

FIG. 1A is a schematic three-dimensional view of a solder 110 according to a first embodiment. FIG. 1B and FIG. 1C are cross-sectional views taken along a line AA' and a line BB' of FIG. 1A, respectively.

With reference to FIG. 1A to FIG. 1C, the solder 110 includes a zinc-based material 112, a copper film 114, and a noble metal film 116. According to FIG. 1B and FIG. 1C, the copper film 114 completely covers a surface 112a of the zinc-based material 112, and the noble metal film 116 completely covers the copper film 114.

In this disclosure, the "zinc-based material" refers to a metal layer essentially contains zinc. In various embodiments, the zinc-based material may be a zinc-based solder, of which the material may be zinc, zinc-tin alloy, zinc-aluminum alloy, or zinc-aluminum-copper alloy. In an embodiment, the content of zinc of the zinc-based material is more than 90 wt %, for example.

In this disclosure, the "noble metal" refers to gold, palladium, platinum, rhodium, silver, ruthenium, osmium, or iridium. Common noble metal is gold, silver, or palladium, for example. In the following embodiments, noble metal is gold, for example.

Figure 2A:
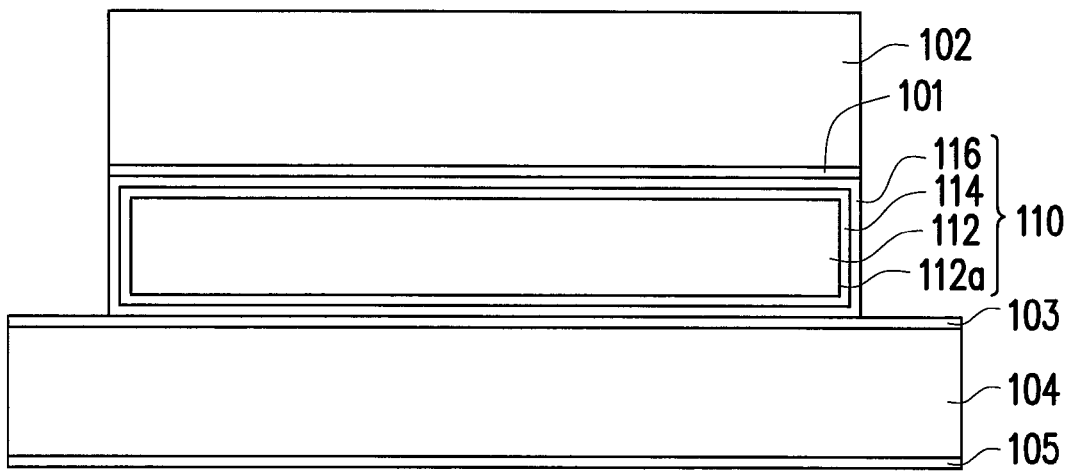
FIG. 2A to FIG. 2C are cross-sectional views of processes of a method of forming a package structure according to a second embodiment.
Figure 2B:
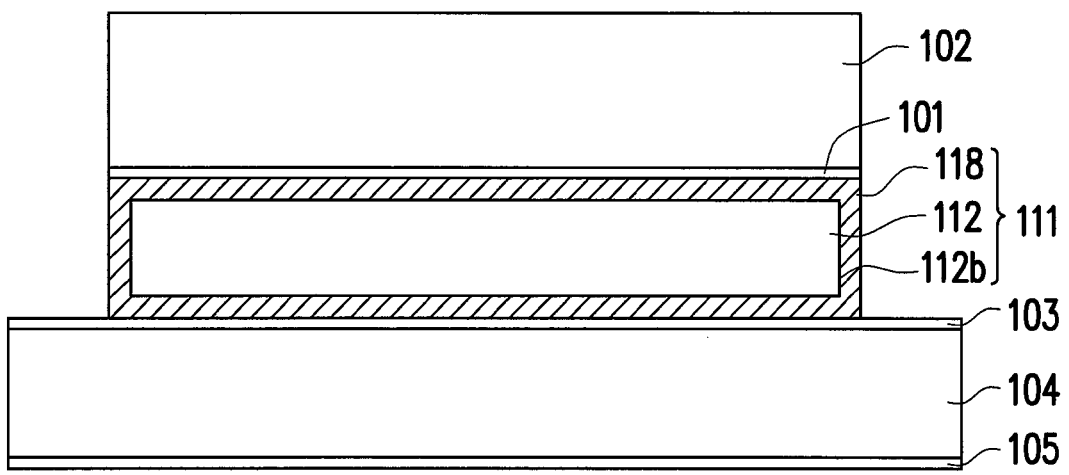
Figure 2C:
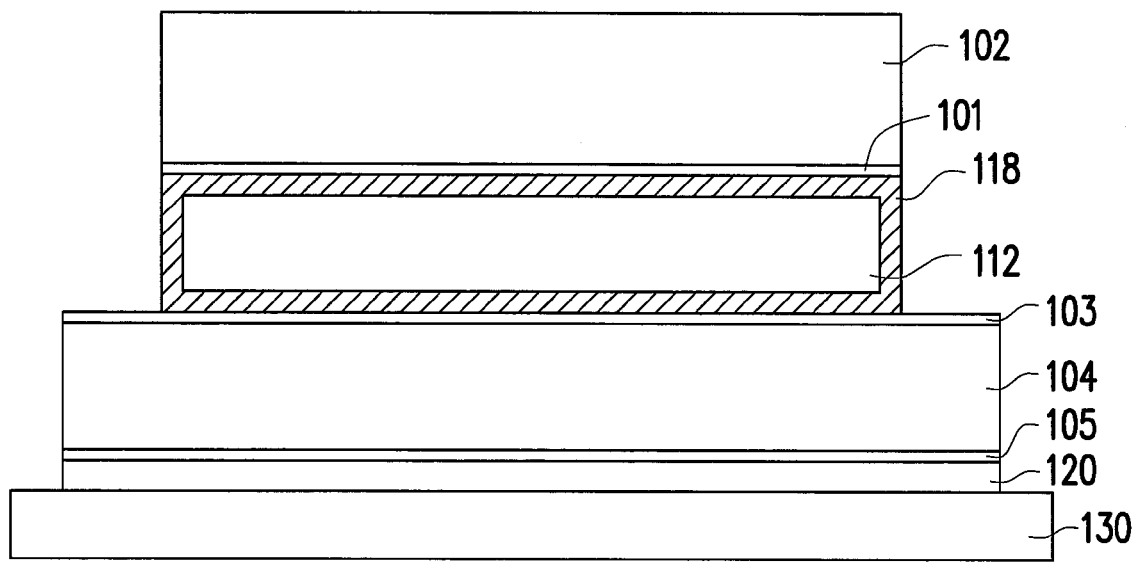

FIG. 2A to FIG. 2C are cross-sectional views of processes of a method of forming a package structure according to a second embodiment.

With reference to FIG. 2A, a chip 102 and a carrier 104 are provided. The chip 102 may be any type of semiconductor chips. Classified by the material of a substrate, the chip 102 may be a Si-based device, a SiC-based device, or a GaN-based device, for example. Classified by the type of the device, the chip 102 may be a metal oxide semiconductor field effect transistor chip (MOSFET chip) or an insulated gate bipolar transistor chip (IGBT chip), for example. The carrier 104 may be any substrate suitable for being bonded to the chip 102, such as a copper substrate, a direct bonded copper (DBC) substrate, a silicon interlayer, a lead frame, a copper plating ceramic substrate, a printed circuit board, or another chip.

A solder 110 is disposed between the chip 102 and the carrier 104, and the solder 110 may be formed in advance and stored for later use.

As described in the first embodiment, the solder 110 includes a zinc-based material 112, a copper film 114, and a noble metal film 116. The zinc-based material 112 has a surface 112a. In this embodiment, the surface 112a refers to the whole outer surface of the zinc-based material 112. As shown in FIG. 2A, the surface 112a includes a top surface, a bottom surface, and a side surface of the zinc-based material 112. The copper film 114 completely covers the surface 112a of the zinc-based material 112, and the noble metal film 116 further completely covers the copper film 114. The copper film 114 between the zinc-based material 112 and the noble metal film 116 may prevent the reaction between the zinc-based material 112 and the noble metal film 116 during the storage period of the solder 110. The copper film 114 and the noble metal film 116 are formed by sputtering, for example, but the disclosure is not limited thereto. Any process in the field of deposition suitable for forming a metal thin film may be applied to form the copper film 114 and the noble metal film 116.

In addition, a metal layer 101 may be further formed on the chip 102. The metal layer 101 is disposed on a surface of the chip 102 to be connected with the solder 110. The material of the metal layer 101 is nickel or copper, for example. In the embodiment, the material of the metal layer 101 is copper. Further, a metal layer 103 and a metal layer 105 may be disposed on the up/down surface of the carrier 104, and the materials of the metal layer 103 and the metal layer 105 may be the same as that of the metal layer 101. In the embodiment, the materials of the metal layer 103 and the metal layer 105 may be copper as well. The method of forming the metal layer 101, the metal layer 103, and the metal layer 105 may be the same as the method of forming the copper film 114 and the noble metal film 116.

With reference to FIG. 2B, the solder 110 is bonded. The temperature of this bonding process is determined according to the metal contained in the solder 110. In this embodiment, such temperature is 250° C. to 300° C., for example, and such bonding process is performed by hot pressing or vacuum vapor phase reflow, for example. While the bonding process is performed, pressure may be applied to the solder 110 to prevent the formation of voids in interfaces. Here, the so-called interfaces refer to junctions between the solder and the chip or between the solder and the carrier, i.e., the junctions between the solder 110 and the metal layer 101 and between the solder 110 and the metal layer 103 in the second embodiment.

In the bonding process, metal elements, which are zinc, copper, and gold in the second embodiment, inter-diffuse in the solder 110, so that copper in the copper film 114 is diffused into the zinc-based material 112 and may be located substantially around the surface 112b of the zinc-based material 112 after the bonding process is finished. Thereby, the mechanical properties, such as strength or ductility, of the zinc-based material 112 may be improved, and thus the solder joint structure 111 has favorable reliability. Since copper is diffused into the zinc-based material 112 in the bonding process, compositions of the zinc-based material 112 before the bonding process may be slightly different from those of the zinc-based material 112 after the bonding process. The zinc-based material 112 is mainly made of zinc.

Since the metal elements in the solder 110 can inter-diffuse during the bonding process and further react with one another to form intermetallics, which will be described in detail below, the location of the "surface" of the zinc-based material 112 may change. Therefore, the surface of the zinc-based material 112 undergoing the bonding process is shown as the surface 112b in FIG. 2B, so that the surface 112b is distinct from the surface 112a in FIG. 2A as well as in FIG. 1B and FIG. 1C.

In the second embodiment, the copper contained in the copper film 114 substantially is diffused into the zinc-based material 112, and thus the copper film 114 is substantially not present in the solder joint structure after the forming process is finished.

In the second embodiment, gold in the noble metal film 116 and zinc in the zinc-based material 112 may inter-diffuse, thereby forming an intermetallic layer 118 completely covering the zinc-based metal layer 112. The material of the intermetallic layer 118 is AuZn, $AuZn_3$, $AuZn_8$, $Au_5Zn_3$, $Au_3Zn_7$, $AuZn_2$, $AuZn_7$, or $AuZn_4$, for example.

The intermetallic layer 118 is characterized by high stability and may inhibit the zinc-based material 112 from oxidation. Therefore, interface defects at junctions and the formation of zinc whiskers may be reduced, and temperature resistance and long-term reliability of the package structure may be improved.

With reference to FIG. 2C, according to an embodiment, the chip 102 and the carrier 104 are part of a power module, and after the chip 102 is bonded to the carrier 104, the carrier 104 may be further bonded to a radiator plate 130 through another solder 120, thereby finishing the package process of the power module. This solder 120 may be a conventional solder or may be the same as the solder 110 described above.

Figure 3A:
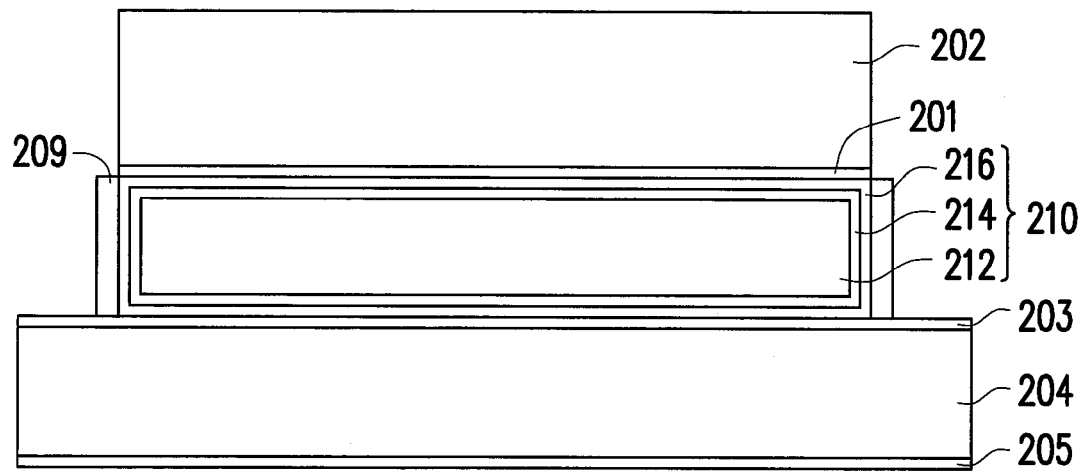
FIG. 3A, FIG. 3B, and FIG. 3F are cross-sectional views of processes of a method of forming a package structure according to a third embodiment.
Figure 3B:
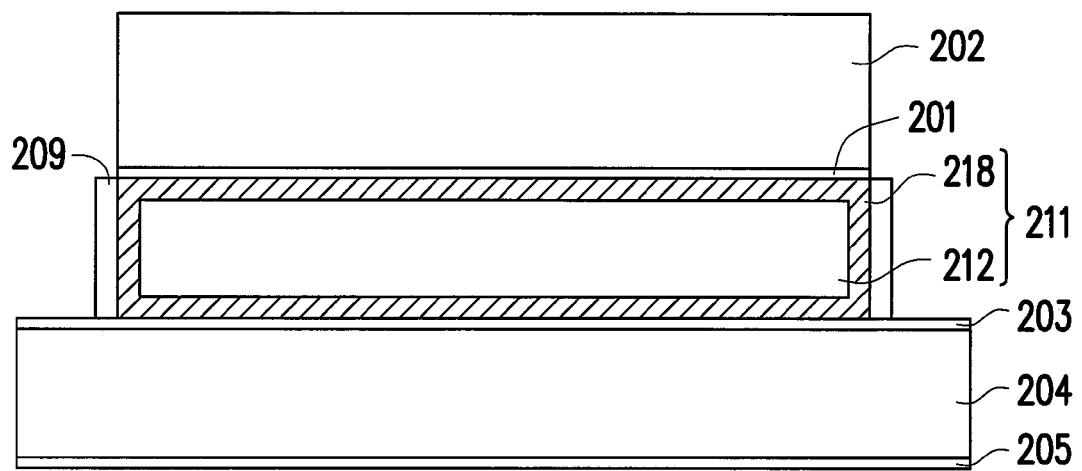
Figure 3C:
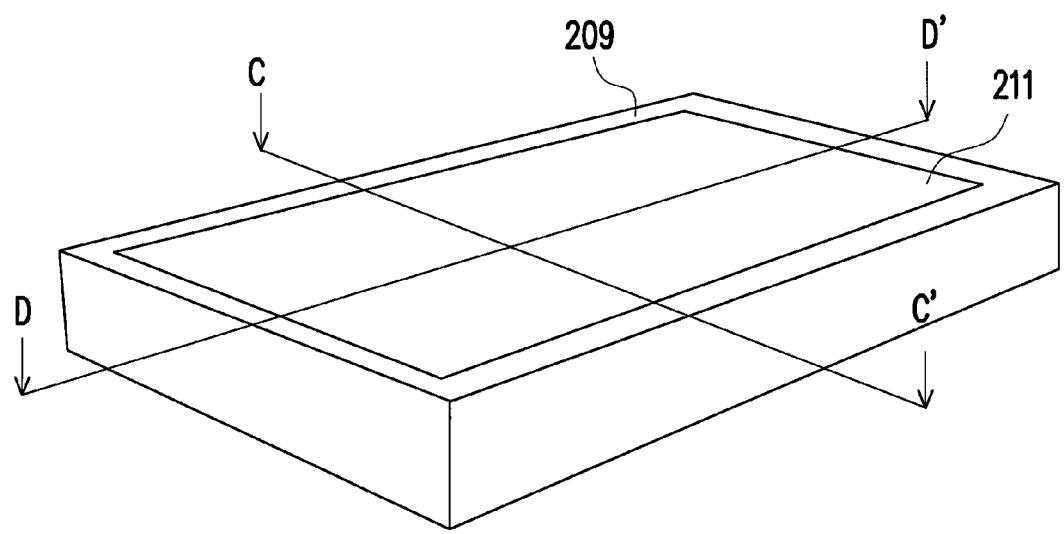
FIG. 3C is a schematic three-dimensional view of a solder joint structure according to the third embodiment.
Figure 3D:
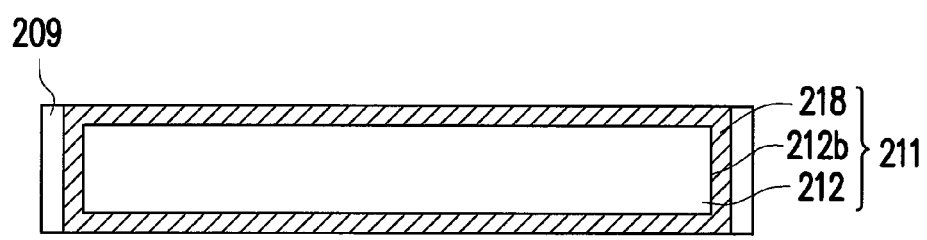
FIG. 3D and FIG. 3E are cross-sectional views taken along a line CC' and a line DD' of FIG. 3C, respectively.
Figure 3E:
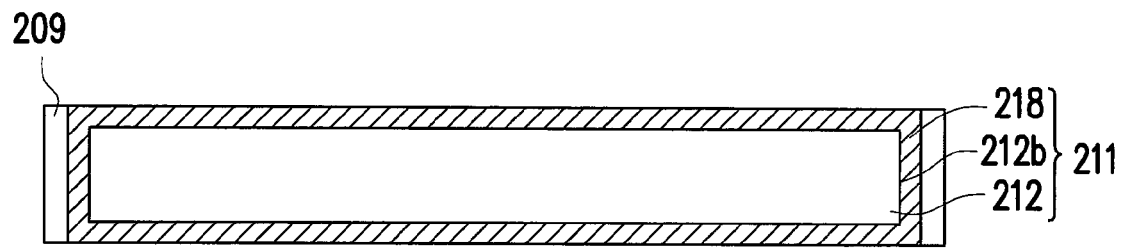
Figure 3F:
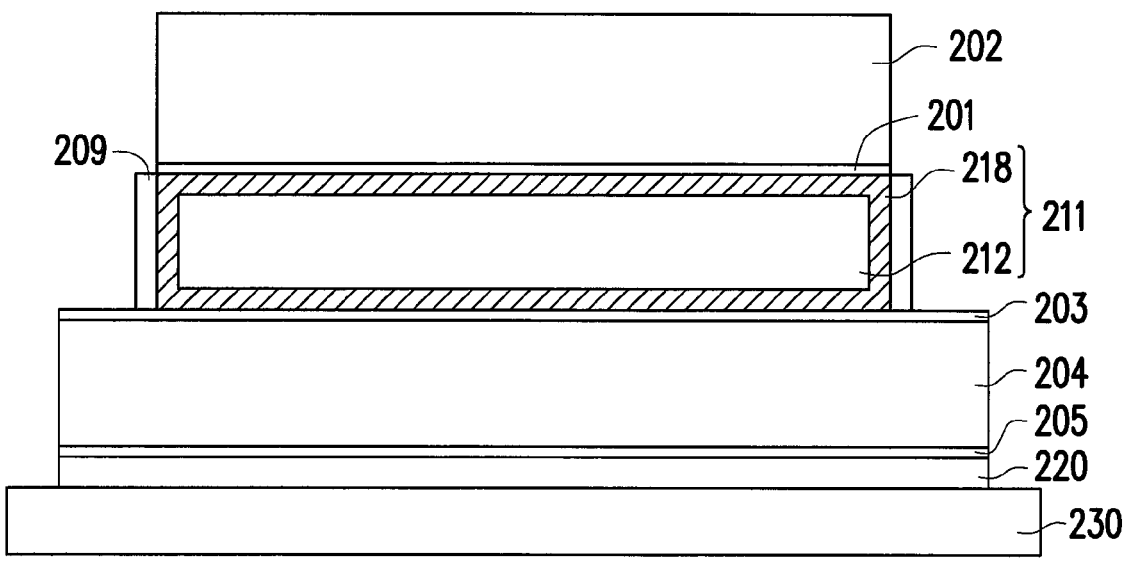

FIG. 3A, FIG. 3B and FIG. 3F are cross-sectional views of processes of a method of forming a package structure according to a third embodiment.

With reference to FIG. 3A, the method of forming a package structure includes following steps. A chip 202 and a carrier 204 are provided, and a solder 210 is disposed between the chip 202 and the carrier 204. The solder 210 includes a zinc-based material 212, a copper film 214, and a noble metal film 216. In addition, a metal layer 201 may be further formed on the chip 202, and a metal layer 203 and a metal layer 205 may also be disposed on a top surface and a bottom surface of the carrier 204.

The chip 202, the carrier 204, the solder 210 (including the zinc-based material 212, the copper film 214, and the noble metal film 216), the metal layer 201, the metal layer 203, and the metal layer 205 may be the same as those correspondingly described in the second embodiment, and the relevant descriptions thereof may thus be omitted hereinafter.

The difference between the third embodiment and the second embodiment lies in that a high-melting point metal layer 209 disposed around the solder 210 is formed on the carrier 204 before the solder 210 is bonded.

In this disclosure, the "high-melting point metal" refers to metal of which the melting point is higher than the melting point of zinc, i.e., metal of which the melting point is higher than 300° C. In various embodiments, the material of the high-melting point metal layer 209 is gold, silver, or copper, for example. In the third embodiment, the material of the high-melting point metal layer 209 is copper.

With reference to FIG. 3B, the solder 210 and the high-melting point metal layer 209 are bonded. The temperature of this bonding process, the manner in which this bonding process is performed, and the interaction of metal elements contained in the solder 210 and the zinc-based material 212 in this bonding process may be the same as those described in the second embodiment, and the relevant descriptions thereof may thus be omitted hereinafter. The melting point of the high-melting point metal layer 209 is higher than the temperature of the bonding process, so that the high-melting point metal layer 209 may not react with any metal layer in the solder 210 during the bonding process.

After the bonding process is performed, the solder 210 is transformed into a solder joint structure 211. The solder joint structure 211 includes the zinc-based material 212 and an intermetallic layer 218. The intermetallic layer 218 completely covers the zinc-based material 212, and the material of the intermetallic layer 218 may be the same as that of the intermetallic layer 118 described in the second embodiment. After bonding, the high-melting point metal layer 209 acts as a stopper which may prevent the chip 202 from skewing and collapsing and may act as a stress free layer of the zinc-based solder joint when the package structure is under shear stress.

In order to more clearly show the concept of the disclosure, a schematic three-dimensional view of the solder joint structure 211 and the high-melting point metal layer 209 is shown in FIG. 3C. FIG. 3D and FIG. 3E are cross-sectional views taken along a line CC' and a line DD' of FIG. 3C, respectively.

As shown in FIG. 3C to FIG. 3E, when the solder 210 is used in the bonding process, the solder 210 is transformed into the solder joint structure 211 due to heat. The solder joint structure 211 includes the zinc-based material 212 and the intermetallic layer 218. The intermetallic layer 218 consists of zinc and the noble metal, and the intermetallic layer 218 completely covers a surface 212b of the zinc-based material 212, as seen in FIG. 3D and FIG. 3E. In this embodiment, the material of the intermetallic layer 218 is AuZn, $AuZn_3$, $AuZn_8$, $Au_5Zn_3$, $Au_3Zn_7$, $AuZn_2$, $AuZn_7$, or $AuZn_4$, for example. In addition, according to other embodiments that the material of the noble metal layer is silver or palladium, the material of the intermetallic layer may be AgZn, $AgZn_3$, $Ag_5Zn_8$, PdZn, $Pd_2Zn$, $PdZn_2$, or $Pd_2Zn_8$. The high-melting point metal layer 209 is disposed around the intermetallic layer 218.

As shown in FIG. 3F, according to an embodiment, the chip 202 and the carrier 204 are part of a power module, and after the chip 202 is bonded to the carrier 204, the carrier 204 may be further bonded to a radiator plate 230 through another solder 220, thereby finishing the package process of the power module. The solder 220 may be a conventional solder or may be the same as the solder 210 described above.

Several embodiments have been described above according to the concept of the disclosure. The shape or the size of the solder joint structure of the disclosure are not particularly limited. However, the zinc-based metal itself is a solder with high temperature resistance, and thus the zinc-based metal may be applied for bonding the power chips in some particular embodiments. In this case, the solder joint structure may have a sheet-like shape, and the sheet-like solder joint structure may be conducive to large-area solder joint, so as to well attach a power chip to a DBC substrate or attach a DBC substrate to a radiator plate.

To sum up, the zinc-based material, the copper film on the surface of the zinc-based material, and the noble metal film on the copper film collectively serve as the solder according to the previous embodiments, and thus the solder has good storage stability. When this solder is employed for packaging semiconductor devices, the expected peak temperatures of the packaging process may be reduced (e.g., to at most 280° C.). Zinc reacts with noble metal in the solder to form an intermetallic layer, and the intermetallic layer acts as a diffusion barrier layer which may prevent zinc from reacting with copper on the carrier or on the chip in order not to form intermetallics, such as $CuZn_5$ and $Cu_5Zn_8$. This is because the Cu—Zn intermetallics are rather unstable and are likely to deteriorate the reliability of solder joints. Besides, the intermetallic layer acting as a diffusion barrier layer may further prevent interface defects, high temperature resistant solder joints with favourable reliability may be formed, and long-term reliability of power modules may be effectively improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solder joint structure, comprising:
   a zinc-based material, having a surface, wherein the zinc-based material comprises copper; and
   an intermetallic layer, consisting of an alloy of zinc and noble metal, wherein the noble metal comprises gold, silver, or palladium, and the intemetallic layer completely covers the surface of the zinc-based material.

2. The solder joint structure of claim 1, wherein a material of the zinc-based material comprises zinc, zinc-tin alloy, zinc-aluminum alloy, or zinc-aluminum-copper alloy, and zinc accounts for more than 90 wt% of the zinc-based material.

3. The solder joint structure of claim 1, wherein a material of the intermetallic layer comprises AuZn, $AuZn_3$, $AuZn_8$, $Au_5Zn_3$, $Au_3Zn_7$, $AuZn_2$, $AuZn_7$, $AuZn_4$, AgZn, $AgZn_3$, $Ag_5Zn_8$, PdZn, $Pd_2Zn$, $PdZn_2$, or $Pd_2Zn_8$.

4. The solder joint structure of claim 1, further comprising a high-melting point metal layer disposed around the intermetallic layer.

5. A method of forming a solder joint structure, comprising:
   providing a solder, the solder comprising:
   a zinc-based material, having a surface;
   a copper film, completely covering the surface of the zinc-based material; and
   a noble metal film, completely covering the copper film; and
   bonding the solder to diffuse copper contained in the copper film into the zinc-based material, and to allow noble metal contained in the noble metal film to react with zinc contained in the zinc-based material so as to form an intermetallic layer consisting of an alloy of zinc and noble metal, wherein the noble metal comprises gold, silver, or palladium, and the intermetallic layer completely covers the zinc-based material.

6. The method of forming the solder joint structure of claim 5, wherein a material of the zinc-based material comprises zinc, zinc-tin alloy, zinc-aluminum alloy, or zinc-aluminum-copper alloy, and zinc accounts for more than 90 wt% of the zinc-based material.

7. The method of forming the solder joint structure of claim 5, wherein a material of the intermetallic layer comprises $AuZn$, $AuZn_3$, $AuZn_8$, $Au_5Zn_3$, $Au_3Zn_7$, $AuZn_2$, $AuZn_7$, $AuZn_4$, $AgZn$, $AgZn_3$, $Ag_5Zn_8$, $PdZn$, $Pd_2Zn$, $PdZn_2$, or $Pd_2Zn_8$.

* * * * *